(12) United States Patent
Dobbs et al.

(10) Patent No.: US 7,136,283 B2
(45) Date of Patent: Nov. 14, 2006

(54) MULTI-COMPUTER SYSTEM

(75) Inventors: Robert W. Dobbs, Granite Bay, CA (US); Stephan K. Barsun, Davis, CA (US); Kevin M. Somervill, Newport News, VA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 150 days.

(21) Appl. No.: 10/459,172

(22) Filed: Jun. 11, 2003

(65) Prior Publication Data

US 2004/0252467 A1 Dec. 16, 2004

(51) Int. Cl.
*G06F 1/16* (2006.01)
(52) U.S. Cl. ............... 361/685; 361/796; 174/52.1
(58) Field of Classification Search ........ 361/679–687, 361/724–727, 690, 796, 752–753, 788, 802; 174/52.1
See application file for complete search history.

(56) References Cited

U.S. PATENT DOCUMENTS

| | | | |
|---|---|---|---|
| 5,038,308 A | 8/1991 | Le et al. ............... | 361/796 |
| 5,101,320 A | 3/1992 | Bhargava et al. ........ | 361/694 |
| 5,592,366 A | 1/1997 | Goldman et al. ........ | 361/796 |
| 5,642,264 A | 6/1997 | Cantrell ............... | 361/802 |
| 5,684,671 A | 11/1997 | Hobbs et al. ........... | 361/683 |
| 5,991,163 A | 11/1999 | Marconi et al. ........ | 361/788 |
| 6,008,995 A | 12/1999 | Pusateri et al. ........ | 361/796 |
| 6,115,258 A | 9/2000 | Hoyle, Jr. et al. ...... | 361/752 |
| 6,128,187 A | 10/2000 | Mimlitch, III et al. .... | 361/690 |
| 6,128,196 A | 10/2000 | Hoyle, Jr. et al. ...... | 361/752 |
| 6,201,705 B1 | 3/2001 | Nygren et al. .......... | 361/753 |
| 6,304,456 B1 | 10/2001 | Wortman ............... | 361/796 |
| 6,323,423 B1 | 11/2001 | Tirrell et al. .......... | 174/52.1 |
| 6,324,062 B1 * | 11/2001 | Treiber et al. .......... | 361/727 |
| 6,335,868 B1 | 1/2002 | Butterbaugh et al. ..... | 361/796 |
| 6,366,464 B1 | 4/2002 | Cosley et al. .......... | 361/752 |
| 6,452,789 B1 | 9/2002 | Pallotti et al. ......... | 361/683 |
| 6,459,589 B1 | 10/2002 | Manweiler et al. ...... | 361/752 |
| 6,493,239 B1 | 12/2002 | Ando et al. ............ | 361/796 |
| 6,498,732 B1 | 12/2002 | Sucharczuk et al. ..... | 361/796 |
| 6,686,958 B1 * | 2/2004 | Watanabe et al. ....... | 348/231.1 |
| 2003/0021090 A1 | 1/2003 | Miksch ................ | 361/725 |
| 2004/0057203 A1 * | 3/2004 | Rabinovitz ............ | 361/685 |

* cited by examiner

*Primary Examiner*—Hung Van Duong

(57) ABSTRACT

A multi-computer system includes a chassis and a plurality of computers within the chassis operable independent of one another. Each computer has a plurality of subassemblies. The subassemblies of different computers are physically grouped together within the chassis based upon at least one of size, function or configuration.

78 Claims, 2 Drawing Sheets

MULTI-COMPUTER SYSTEM

CROSS-REFERENCE TO RELATED PATENT APPLICATIONS

The present application is related to co-pending U.S. application Ser. No. 10/459,075 by Robert W. Dobbs, Stephan K. Barsun and Kevin M. Somervill entitled COMPUTER SYSTEM and filed on the same date herewith, the full disclosure of which is hereby incorporated by reference.

BACKGROUND OF THE INVENTION

Many of today's applications require extremely large computing and memory capacity. As a result, larger and larger computer systems are commonly being used in such applications. However, because such larger computer systems have many more system components and much more complex system components, such larger computer systems are more vulnerable to breakdown or failure. As a result, many applications alternatively use a multitude of independently operable computer systems since simultaneous failure of all of the computer systems is generally unlikely and since the use of multiple computer systems enables repair or servicing of a single computer system while the other computer systems continue operation. Unfortunately, multiple independent computer systems require large amounts of space which is frequently not available in either the rack or other structure supporting the individual computer systems or in the general floor space containing the multiple independent computer systems.

DETAILED DESCRIPTION OF EXAMPLE EMBODIMENT

Figure 1:
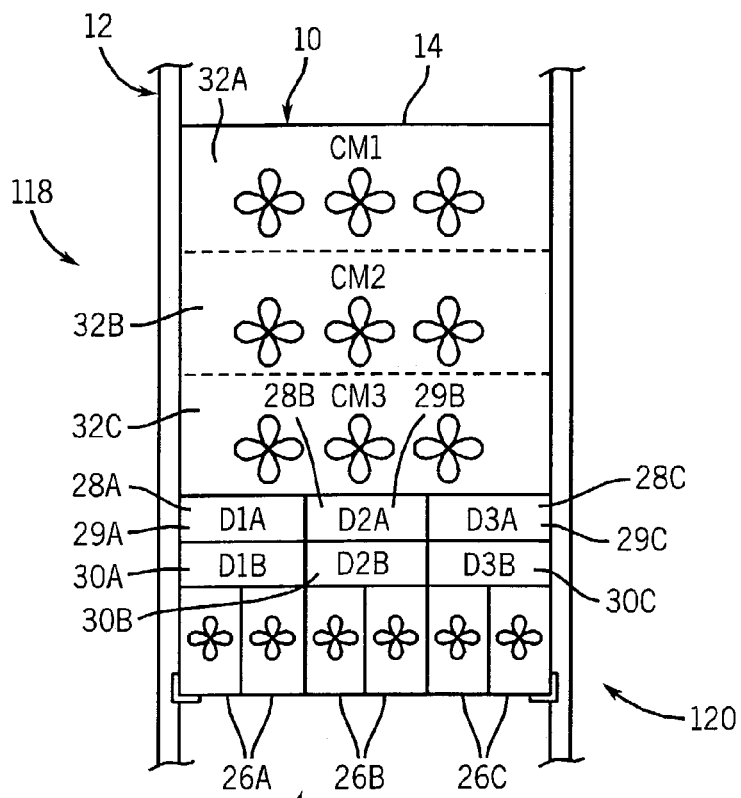
FIG. 1 is a front view schematically illustrating an example of the multi-computer system of the present invention.
Figure 2:
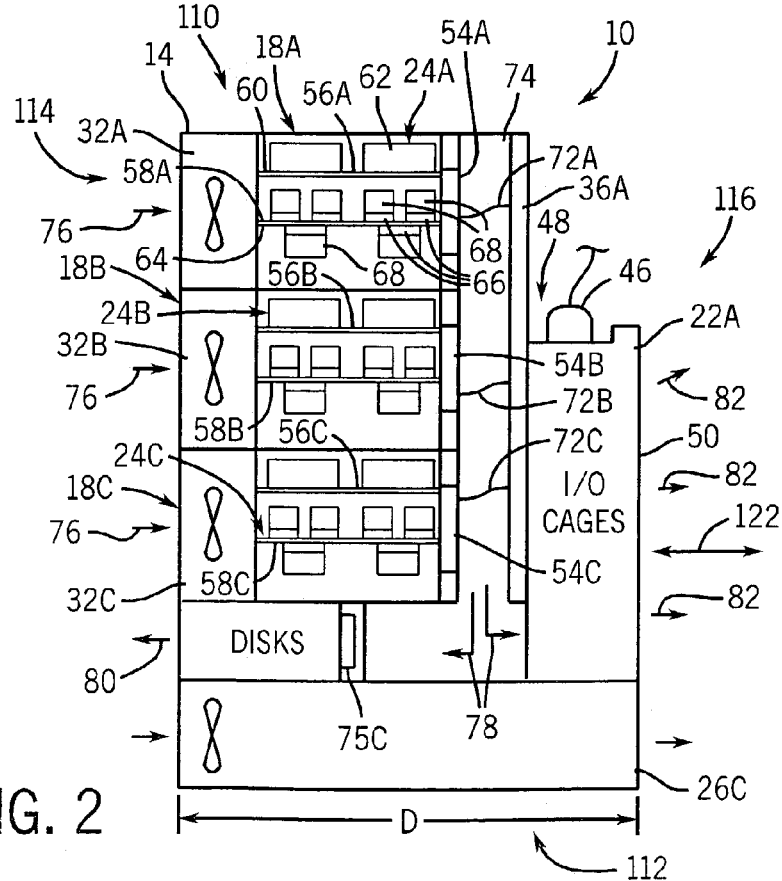
FIG. 2 is a side elevational view schematically illustrating the multi-computer system of FIG. 1.
Figure 3:
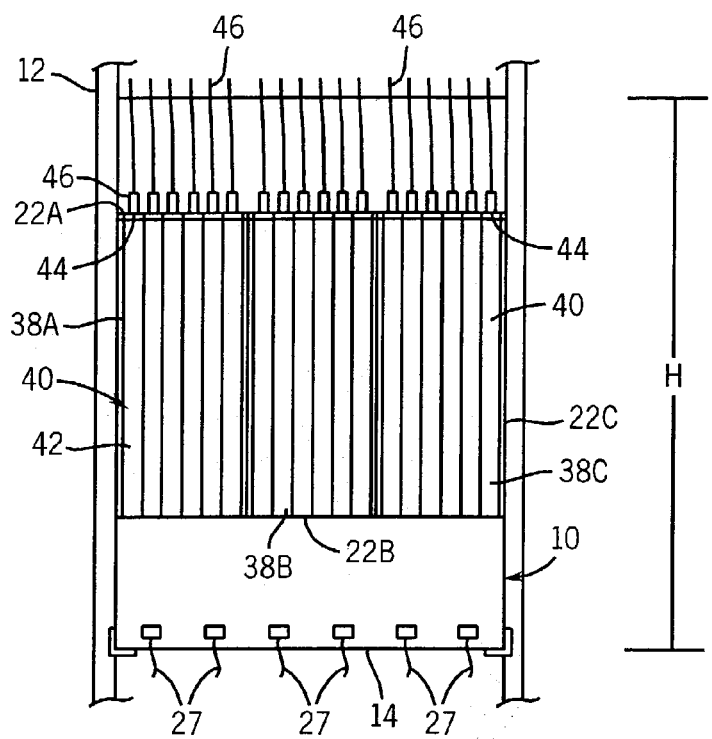
FIG. 3 is a rear elevational view schematically illustrating the multi-computer system of FIG. 1.

FIGS. 1–4 schematically illustrate a multi-computer system 10. FIGS. 1 and 3 further illustrate system 110 supported by a vertical support unit 12. Vertical support unit 12 generally comprises a structure configured for supporting at least one multi-computer support system 10 in a vertical orientation. In the particular embodiment illustrated, vertical support unit 12 comprises a conventionally known rack. In particular, vertical support unit 12 comprises a conventionally known rack configured for the NEBS (telecom marketplace) in which the rack has a depth of approximately 20 inches. In alternative applications, vertical support unit 12 may comprise other structures besides a rack such as closets, or other structures. Moreover, vertical support unit 12 may have other dimensions.

Multi-computer system 10 generally includes chassis 14 and three independently operable and independently serviceable computers 18A, 18B and 18C. Chassis 14 generally comprises one or more structures that function as a framework for joining the various system components of computers 18A, 18B and 18C together in a compact single assembly. In particular applications, chassis 16 includes multiple panels that form openings to receive the various system components of computers 18A, 18B and 18C, wherein the individual system components mount relative to one another and to the chassis within the openings. In some embodiments, chassis 14 additionally provides internal framework structures for supporting the various system components of computers 18A, 18B and 18C. In still other embodiments, chassis 14 only comprises a series of interior framework structures configured to mount the various system components of computers 18A, 18B and 18C to one another to form a single unit or system, wherein the exterior of the multi-computer system is provided by portions of the exterior surface of the individual system components of each of computers 18A, 18B and 18C. For example, the various system components of computers 18A, 18B and 18C may themselves have housings with exterior surfaces. When the system components of computers 18A, 18B and 18C are joined to one another by chassis 14, the exterior surface of one system component of computer 18A may form a top of computer system 10 while the exterior surface of a system component of computer 18C may form a side of system 10 depending upon the relative position of the system components of the three computers relative to one another. In the particular embodiment illustrated in which Chassis 14 provides openings into which the system components are mounted, chassis 14 has a top 110, a bottom 112, a front 114, a rear 116, a first side 118 and a second side 120.

Computers 18A, 18B and 18C are each located within or interconnected by chassis 14, yet are operable independent of one another. Each of computers 18A, 18B and 18C has a plurality of system components. For purposes of this disclosure, the term "system components" means any modular unit or subassembly which comprises a distinct portion of a particular computer 18. The term "function subassemblies" shall mean those system components which are dedicated to performing one or more functions required of the computer. Examples of such functions include inputting and outputting data signals, processing data signals, storing data signals via such mediums as memory cards, hard disks or removable disks, supplying power or cooling. In alternative multi-computer systems, other functions may be provided by such function subassemblies.

In the particular embodiment illustrated, computers 18A, 18B and 18C include input-output (I/O) subassemblies 22A, 22B and 22C, processor-memory (PM) subassemblies 24A, 24B and 24C, power supply subassemblies 26A, 26B and 26C, disk drive subassemblies 28A, 28B and 28C and cooling subassemblies 32A, 32B and 32C, respectively. I/O subassemblies 22A, 22B and 22C each independently function to input and output data signals to and from their respective computers 18A, 18B and 18C, respectively.

I/O subassemblies 22A, 22B and 22C are each located along the rear 116 of chassis 14. I/O subassemblies 22A, 22B and 22C are physically grouped together in one common area or portion of chassis 14. In the embodiment illustrated, subassemblies 22A, 22B and 22C are grouped together at the rear 116 of chassis 14. As a result, subassemblies 22A, 22B and 22C occupy or require less space as compared to when each of subassemblies 22A, 22B and 22C is supported with an independent chassis of each of their respective computers. In the particular embodiment illustrated, subassemblies 22A, 22B and 22C extend adjacent to one another to provide a compact arrangement of subassemblies.

Figure 4:
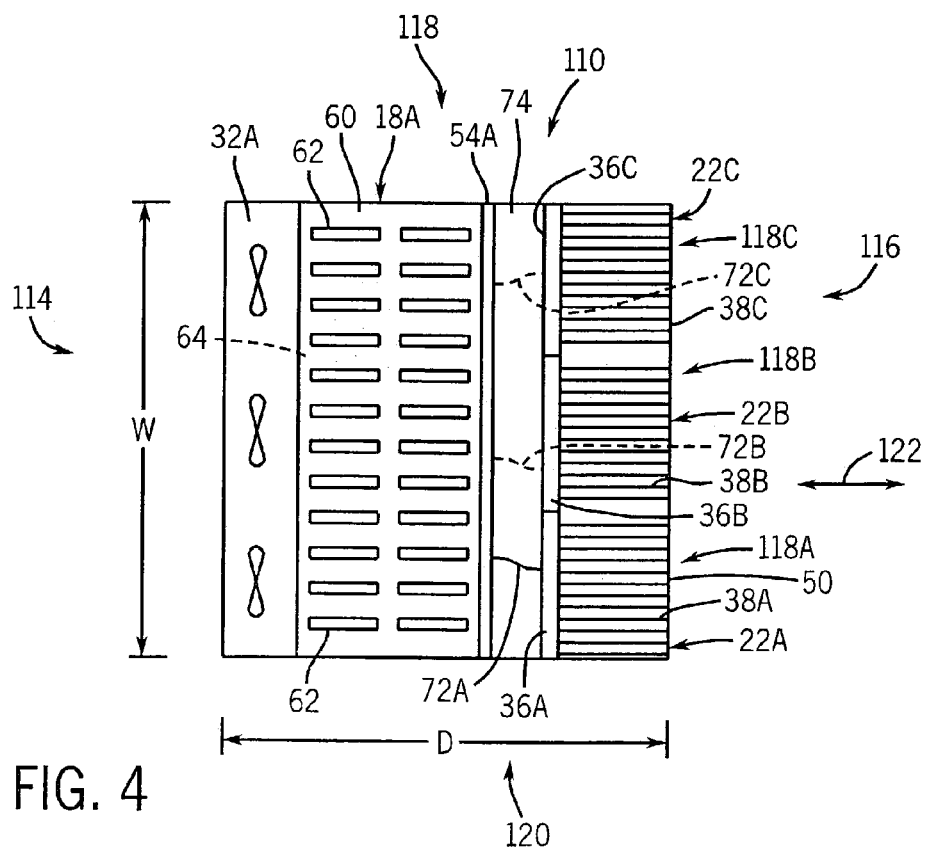
FIG. 4 is a top plan view schematically illustrating the computer system of FIG. 1.

Subassemblies 22A, 22B and 22C include I/O backplanes 36A, 36B and 36C and I/O card sets 38A, 38B and 38C, respectively. I/O backplanes 36A, 36B and 36C each comprise a printed circuit board having a plurality of conventionally known or future developed connectors (not shown) configured to connect a plurality of I/O cards. Each of I/O backplanes 36A, 36B and 36C generally extends in a vertical plane. Each of backplanes 36A, 36B and 36C has a major dimension and a minor dimension, wherein the major dimension extends in a vertical plane. As best shown by FIG. 4, backplanes 36A, 36B and 36C extend within a common plane and are generally situated end to end from side 118 to side 120 of chassis 14 with their connectors facing in a rearward direction. Because backplanes 36A, 36B and 36C extend in a common plane, additional space savings and compactness is achieved.

I/O card sets 38A, 38B and 38C each include a plurality of I/O cards 40. Cards 40 generally extend parallel to one another when connected to their respective backplanes 36A, 36B and 36C. In the particular embodiment illustrated, cards 40 of each set 38A, 38B, 38C are supported in relationship to one another within an I/O cage which facilitates simultaneous connection of cards 40 of each set to their respective backplanes. In alternative embodiments, cards 40 of each set 38A, 38B and 38C may be individually and independently connected to their respective backplanes 36A, 36B and 36C.

Each card 40 includes a printed circuit board 42 and an external connection bulkhead 44. Printed circuit board 42 is a conventionally known or future developed printed circuit board specifically configured for the transmission of input or output data signals. Connection bulkhead 44 is a faceplate generally extending along an edge of printed circuit board 42 and including one or more conventionally known or future developed connectors configured to connect I/O cables, such as cables 46, to printed circuit board 42.

As best shown by FIGS. 2 and 3, when cards 40 are connected to their respective backplanes 36A, 36B and 36C, connection bulkheads 44 face in a vertical (up or down) direction. In the particular embodiment shown, connection bulkheads 44 face in an upward direction. As shown by FIG. 2, chassis 14 is generally stepped along rear 116 so as to form a shoulder 48 along which connection bulkheads 44 extend.

As a result of this configuration, several benefits are achieved. First, because cards 40 are connected to their respective backplanes 36A, 36B, 36C along a vertical interface, connection and disconnection of cards 40 to and from their respective backplanes 36A, 36B and 36C may be performed by moving cards 40 in the direction indicated by arrows 122 (shown in FIGS. 2 and 4). In contrast to many known systems in which I/O cards are connected to a motherboard or backplane along a horizontal interface which requires that the I/O cards be moved vertically during connection and disconnection, I/O cards 40 may be disconnected and connected by moving cards 70 in a horizontal direction. Consequently, cards 40 may be connected and disconnected without requiring removal of a lid or cover to facilitate such vertical movement and without requiring that the entire chassis be at least partially removed from the vertical support unit or rack to facilitate such vertical movement. Because the chassis does not need to be moved for connection or disconnection of the I/O cards 40, cables 46 may be tied to the rack structure (such as rack 12) without service arms or extra cable lengths or loops otherwise required to facilitate movement of the computer system within a rack. In short, system reliability and system uptime are improved by minimizing required steps to service computer system 10.

Second, because external connection bulkheads 44 face in a vertical direction, the connectors provided by bulkheads 44 are more easily viewed and accessed. For example, bulkhead LEDs and labels are more visible. The task of connecting cables 46 is therefore easier. In addition, cable routing is improved. In particular, cables 46 do not block air exhaust through the rear I/O access panel 50 (shown in FIGS. 2 and 4). In those embodiments in which bulkheads 44 face upwardly, cables 46 route up rack 12 toward the ceiling, a preferred location for cable networks, without cable bends.

Third, because cards 40 and, in particular, printed circuit boards 42 have a major dimension that extends vertically when cards 40 are connected to their respective backplanes 36A, 36B and 36C, the overall depth D (see FIGS. 2 and 4) of chassis 14 and of multi-computer system 10 is reduced as compared to known systems in which the major dimension of the I/O cards extend horizontally. In the particular embodiment illustrated, cards 40 comprise standard unmodified PCI/PCI-X cards. With standard full-length PCI/PCI-X cards having a major length of 12.8 inches and a minor width of 4.8 inches, the depth D of chassis 14 is reduced by 8 inches. In another application in which cards 40 utilize only standard half-length PCI/PCI-X cards having a major length of 7 inches and a minor width of 4.8 inches, depth D is reduced by 2.2 inches. In still another embodiment in which cards 40 comprise common ¾-length PCI/PCI-X cards having a major length 8.8 inches or shorter and a minor width 4.8, depth D is reduced by 4 inches. As a result, depth D of chassis 14 is reduced enabling shallower vertical support units or racks. In the particular embodiment illustrated, I/O subassemblies 22A, 22B and 22C enable each computer 18A, 18B or 18C to have only a 20 inch depth D. As a result, multi-computer system 10 provides true front-back service access in only a 20 inch depth chassis suited for NEBS industry (the telecom marketplace).

Each of the above described three benefits achieved by each of I/O subassemblies 22A, 22B and 22C may be provided independent of one another in particular applications. For example, cards 40 may alternatively be configured so as to connect with their respective backplanes 36A, 36B or 36C along a vertical interface without having bulkheads 44 face in a vertical direction and without having major dimensions that extend vertically. Cards 40 may alternatively be configured such that connection bulkheads 44 face in a vertical direction or upwardly without requiring a vertical connection interface with backplanes 36A, 36B or 36C and without requiring a major dimension of cards 40 to extend vertically. Cards 40 may alternatively be configured so as to have a major dimension that extends vertically without requiring bulkheads 44 to face in a vertical direction and without requiring a vertical connection interface with backplanes 36A, 36B or 36C. However, optimum results are found combining all three features.

In the particular embodiment illustrated, each of I/O subassemblies 22A, 22B and 22C are substantially identical to one another. As a result, the physical grouping of subassemblies 22A, 22B and 22C is better facilitated with greater space savings. In addition, re-engineering of individual system components for volume efficiency is generally not necessary.

Processor-memory (PM) subassemblies 24A, 24B and 24C are function subassemblies that each perform the functions of storing data on memory cards and the function of processing data signals. PM subassemblies 24A, 24B and 24C are physically grouped together within chassis 14 and generally between I/O subassemblies 22A, 22B and 22C and cooling subassemblies 32A, 32B and 32C. PM subassemblies 24A, 24B and 24C each extend from side 118 to side 120 and are arranged vertical to one another. The horizontal arrangement of PM subassemblies 24A, 24B and 24C results in improved volume efficiencies of multi-computer system 10. In the particular embodiment illustrated in FIG. 1, PM subassemblies 24A, 24B and 24C are vertically stacked adjacent to one another. In particular applications, chassis 14 may include intervening support members which have generally minor dimensions. Like I/O subassemblies 22A, 22B, 22C, PM subassemblies 24A, 24B and 24C, by being physically grouped together, achieve volume efficiency to reduce the overall volume required by computers 18A, 18B and 18C.

As best shown by FIGS. 2 and 3, PM subassemblies 24A, 24B and 24C include PM backplanes 54A, 54B, 54C, memory sub-units 56A, 56B, 56C and processor sub-units 58A, 58B and 58C, respectively. PM backplanes 54A, 54B and 54C each generally extends in a vertical plane opposite I/O backplanes 36A, 36B and 36C. Each PM backplane 54A, 54B, 54C generally extends horizontally from side 118 to side 120. As best shown by FIG. 2, PM backplanes 54A, 54B and 54C are supported relative to one another within chassis 14 so as to extend within a single vertical plane. As a result space efficiencies are achieved. Each PM backplane 54A, 54B and 54C generally comprises a printed circuit board having connectors configured to connect a memory sub-unit 56 and a processor sub-unit 58 to the printed circuit board.

Memory sub-units 56A, 56B and 56C each extend from PM backplanes 54A, 54B and 54C towards front 114. Each memory sub-unit 56A, 56B and 56C includes a memory circuit board 60 and a plurality of memory cards 62. Memory circuit board 60 comprises a backplane having a plurality of connectors for releasably connecting memory cards 62. Memory cards 62 are connected to circuit board 60 so as to extend parallel to one another within vertical planes, wherein the sides of cards 62 face sides 118 and sides 120 of chassis 14. In the particular embodiment illustrated, each memory unit 56A, 56B and 56C includes six memory cards 62 such as DIMMS.

Processor sub-units 58A, 58B and 58C extend from PM backplanes 54A, 54B and 54C, respectively, towards front 114. Each processor sub-unit 58A, 58B and 58C includes a processor circuit board 64 and a plurality of processors 66 having associated heatsinks 68. Processor circuit boards 64 comprise circuit boards to which are mounted processors 66 and heatsinks 68. Processors 66 process data signals while heatsinks 68 dissipate generated heat.

In the particular embodiment illustrated, each of PM subassemblies 24A, 24B and 24C are substantially identical to one another. As a result, the physical grouping of subassemblies 24A, 24B and 24C is facilitated for achieving improved volume efficiencies. In addition, re-engineering costs of individual subassemblies for such volume efficiencies is reduced. In alternative embodiments, memory sub-units 56A, 56B, 56C and processor sub-units 58A, 58B and 58C may alternatively be provided as distinct individual subassemblies having their own backplanes.

As shown by FIGS. 2 and 4, computers 18A, 18B and 18C additionally include cables 72A, 72B and 72C, respectively. Cables 72A, 72B and 72C connect PM backplanes 54A, 54B and 54C to I/O backplanes 36A, 36B and 36C, respectively. In particular, cables 72A, 72B and 72C extend through space 74 located between PM backplanes 54 and I/O backplanes 36. Cables 72A, 72B and 72C enable PM backplanes 54 and I/O backplanes 36 to be connected despite the horizontal spacing of I/O backplanes 36 and the vertical spacing or separation of PM backplanes 54. Cables 72A, 72B and 72C transmit data signals from I/O backplanes 36A, 36B and 36C to PM backplanes 54A, 54B and 54C, respectively.

Power supply subassemblies 26A, 26B and 26C generally comprise conventionally known or future developed power supplies and which typically include cooling fans. As best shown by FIG. 1, each computer 18A, 18B and 18C is provided with two power supplies for redundancy in case of failure of one of the power supplies. Power supplies 26A, 26B and 26C receive power from external power sources by power lines 27 (shown in FIG. 3). Power supply subassemblies 26A, 26B and 26C are physically grouped together along bottom 112 of chassis 14. Each power supply 26A, 26B, 26C generally extends from front 114 to rear 116. In the particular embodiment illustrated, power supplies 26A, 26B and 26C are horizontally stacked adjacent to one another. Because power supplies 26A, 26B and 26C are grouped together, volume efficiencies within chassis 14 are achieved.

Disk subassemblies 28A, 28B and 28C generally comprise function subassemblies configured to provide the functions of recording data on a fixed disk such as a hard disk drive and recording and/or reading data to and from a removable disk such as a CD or DVD, for computers 18A, 18B and 18C, respectively. Disk subassemblies 28A, 28B and 28C are physically grouped together proximate front 114 of chassis 14 vertically between power supplies 26A, 26B and 26C and cooling subassemblies 32A, 32B and 32C. Disk subassemblies 28A, 28B and 28C include permanent disk sub-units 29A, 29B, 29C and removable disk sub-units 30A, 30B and 30C, respectively. Each disk subassembly 29A, 29B and 29C further includes a disk backplane 75 (shown in FIG. 2). Disk backplanes 75A, 75B and 75C (only disk backplane 75C is shown) comprise printed circuit boards connected to sub-units 29A, 30A, 29B, 30B, 29C, 30C, respectively. Disk backplanes 75A, 75B and 75C extend in vertical planes. Backplanes 75A, 75B and 75C extend in a single backplane so as to conserve space.

Permanent disk sub-units 29A, 29B, 29C generally comprise permanent memory disks such as a conventionally or future developed hard disk drive. Removable disk sub-units 30A, 30B and 30C each comprise conventionally known removable disk units such as CD drives or DVD drives. In the embodiment illustrated, one or both of disk sub-units 29A, 29B, 29C or removable disk sub-units 30A, 30B and 30C additionally include displays or manual controls or inputs such as push buttons, keypads and the like along front 114 of chassis 14. Alternatively, sub-units 30A, 30B and 30C may comprise secondary permanent memory disks.

Cooling subassemblies 32A, 32B and 32C are generally located along front 114 of chassis 14 and extend horizontally from side 118 to side 120. Cooling subassemblies 32A, 32B and 32C are physically grouped together at front 114 of chassis 14. In the particular embodiment illustrated, cooling subassemblies 32A, 32B and 32C are vertically stacked adjacent to one another along front 114. As a result, volume efficiencies are achieved.

Each cooling subassembly 32A, 32B and 32C generally comprises a conventionally known or future developed forced air cooling system including one or more fans. Subassemblies 32A, 32B and 32C draw air into chassis 14 as indicated by arrows 76 in FIG. 2 which flows through the respective PM subassemblies 24A, 24B and 24C, respectively, and which further flows into and through space 74. Thereafter, as indicated by arrows 78 in FIG. 2, the forced air flows through disk subassemblies 28A, 28B, 28C, 30A, 30B and 30C and out of chassis as indicated by arrow 80 and further through I/O subassemblies 22A, 22B and 22C and out rear 116 of chassis 14 as indicated by arrows 82 to dissipate heat from chassis 14.

Overall, multi-computer system 10 provides a computing system that can handle large quantities of data processing and/or storage in an efficient volume while maintaining improved servicing characteristics of smaller individual computer systems. Multi-computer system 110 compactly provides the computing power of three computers 18A, 18B and 18C in a smaller volume as compared to three individual computer systems. At the same time, should one of computers 18A, 18B and 18C fail or need repair or replacement, the other of computers 18A, 18B and 18C may be maintained in operation. As a result, overall system downtime is reduced.

Multi-computer system 10 also provides greater computing power in a smaller space, eliminating or delaying the need to incur engineering costs for minimizing the actual size of system components or reinventing the same functionality in a denser form-factor which drives up development and supply-chain costs. In contrast, multi-computer system 10 achieves improved volume efficiency while employing standard or previously developed system components. In some applications, the configuration of multi-computer system 10 may be employed with newly developed denser system component to provide even more compact computing power.

In one example, multi-computer system 10 utilizes a chassis 14 that has a maximum depth D of 20 inches, a maximum width W of 17.5 inches and a maximum height H of 26 inches. As a result, this example of multi-computer system 10 is well suited for satisfying NEBS standards in the telecom industry. In this example, I/O cards 40 comprise standard full-length PCI/PCI-X cards of various functions sold by the industry. I/O backplanes 36A, 36B and 36C comprise custom design concept by Hewlett-Packard and generally are 5.5 inches wide and approximately 16 inches long. PM subassemblies 24A, 24B and 24C comprise processor and memory assemblies sold by Hewlett-Packard in IPF servers (rx5670). Power subassemblies 26A, 26B and 26C comprise of SSI power supplies sold by various power supply vendors having dimensions of 12.9 inches in length, 2.74 inches in width and 4.86 inches in height. Disk subassemblies 28A, 28B and 28C comprise standard HALF-HEIGHT disks sold by Hewlett-Packard. Cooling subassemblies 32A, 32B and 32C comprise standard 4.75 inch square by 1.5 inch deep fans sold by various fan vendors.

Multi-computer system 10 conserves space by physically grouping subassemblies of different computers together within the chassis based upon function. For example, each of the input/output subassemblies are grouped together within a single chassis. Each of the three processor-memory subassemblies of the three computers are physically grouped together within the chassis. Likewise, the disk drive subassemblies, the power supply subassemblies and the cooling subassemblies are all physically grouped together within the chassis. In lieu of having subassemblies that are grouped together based upon the function or functions provided by such subassemblies, multi-computer system 10 may alternatively be configured such that subassemblies of different computers are physically grouped together within the chassis based upon other considerations such as size or configuration. For example, power subassemblies on a computer and a larger subassembly of another computer may be physically grouped together within a single chassis to optimally utilize available space within the chassis. Subassemblies may also be physically grouped together based upon the configuration. For example, the particular subassembly of a first computer may fit very compactly with a subassembly of a second computer within a single chassis to conserve space.

Although the present invention has been described with reference to example embodiments, workers skilled in the art will recognize that changes may be made in form and detail without departing from the spirit and scope of the invention. For example, although different example embodiments may have been described as including one or more features providing one or more benefits, it is contemplated that the described features may be interchanged with one another or alternatively be combined with one another in the described example embodiments or in other alternative embodiments. Because the technology of the present invention is relatively complex, not all changes in the technology are foreseeable. The present invention described with reference to the example embodiments and set forth in the following claims is manifestly intended to be as broad as possible. For example, unless specifically otherwise noted, the claims reciting a single particular element also encompass a plurality of such particular elements.

What is claimed is:

1. A multi-computer system comprising:
a chassis;
a first computer within the chassis having a first function subassembly configured to perform at least one function of the computer; and
a second computer within the chassis and operable independent of the first computer, the second computer Including a second function subassembly configured to perform the same at least one function for the second computer that the first function subassembly performs, wherein the first function subassembly and the second function subassembly are grouped together within the chassis, wherein the first function subassembly and the second function subassembly each include:
an I/O backplane; and
a plurality of I/O cards extending parallel to one another and connected to the I/O backplane.

2. The system of claim 1, wherein the first function subassembly and the second function subassembly are Identical to one other.

3. The system of claim 1, wherein the first function subassembly and the second function subassembly extend adjacent one another within the chassis.

4. The system of claim 1 wherein the at least one function is providing a plurality of input/output cards.

5. The system of claim 1, wherein the at least one function is providing at least one processor.

6. The system of claim 1, wherein the at least one function is providing a plurality of memory cards.

7. The system of claim 1, wherein the at least one function is providing power.

8. The system of claim 1, wherein the I/O backplane of the first subassembly and the I/O backplane of the second subassembly extend in a single plane within the chassis.

9. The system of claim 1, wherein the I/O backplane of the first subassembly extends in a vertical plane within the chassis.

10. The system of claim 1, wherein each of the plurality of I/O cards has a major length and a minor width, wherein each card includes a connection bulkhead extending along the width and wherein each I/O card is connected to the I/O backplane along the length.

11. The system of claim 1, wherein each I/O card of the plurality of I/O cards has a connection bulkhead facing upwardly.

12. The system of claim 1, wherein the I/O backplane of the first function subassembly and the I/O backplane of the second function subassembly each have a major dimension and a minor dimension, wherein the major dimension extends vertically within the chassis.

13. The system of claim 1, wherein the first function subassembly and the second function subassembly each include:
   a processor-memory (PM) backplane;
   a plurality of memory cards coupled to the PM backplane; and
   a plurality of processors coupled to the PM backplane.

14. The system of claim 1 including a third computer within the chassis and operable independent of the first computer and the second computer, wherein the third computer has a third function subassembly that performs the same functions as the first function subassembly and the second function subassembly and wherein the third function subassembly is grouped with the first function subassembly and the second function subassembly within the chassis.

15. The system of claim 1, wherein the first function subassembly and the second function subassembly are grouped together without Intervening walls.

16. The system of claim 1, wherein the first computer includes a third function subassembly and a fourth function subassembly, wherein the second computer includes a fifth function subassembly and a sixth function subassembly, wherein the first function subassembly and the second function subassembly form, a first function subassembly group, wherein the third function subassembly and the fifth function subassembly are grouped together within the chassis to form a second function subassembly group, wherein the fourth function subassembly and the sixth function subassembly are grouped together within the chassis to form a third function subassembly group and wherein the third function subassembly group is between the first function subassembly group and the second function subassembly group.

17. The system of claim 5, wherein the at least one function is providing a plurality of memory cards.

18. The system of claim 8, wherein the I/O backplane of the first subassembly extends in a vertical plane within the chassis.

19. The system of claim 11, wherein the chassis is stepped to form a shoulder and wherein each connection bulkhead extends along the shoulder.

20. The system of claim 11, wherein each I/O card is a standard PCI/PCI-X card.

21. The system of claim 12, wherein the first computer includes a third function subassembly and wherein the second computer includes a fourth function subassembly, wherein the third function subassembly and the fourth function subassembly perform at least one substantially identical function for the first computer and the second computer, respectively.

22. The system of claim 13 including a processor circuit board connected to the PM backplane, wherein the plurality of processors are connected to the processor circuit board.

23. The system of claim 13, wherein the PM backplane of the first function subassembly and the PM backplane of the second function subassembly extend in a single plane.

24. The system of claim 13, wherein the PM backplane of the first function subassembly extends in a horizontal plane.

25. The system of claim 14, wherein the third function subassembly is Identical to the first function subassembly and identical to the second function subassembly.

26. The system of claim 14, wherein the first function subassembly, the second function subassembly and the third function subassembly each include:
   an input-output (I/O) backplane; and
   a plurality of VO cards connected to the I/O backplane.

27. The system of claim 21, wherein the third function subassembly and the fourth function subassembly are substantially identical.

28. The system of claim 21, wherein the first computer includes a fifth function subassembly and wherein the second computer includes a sixth function subassembly and wherein the fifth and sixth function subassemblies perform substantially the same functions for the first computer and the second computer, respectively.

29. The system of claim 22 including a memory circuit board connected to the PM backplane, wherein the plurality of memory cards are connected to the memory circuit board.

30. The system of claim 23, wherein the PM backplane of the first function subassembly extends in a horizontal plane.

31. The system of claim 26, wherein the first, second and third computers include a fourth, fifth and sixth function subassembly, respectively, and wherein the fourth function subassembly, the fifth function subassembly and the sixth function subassembly are grouped together within the chassis.

32. The system of claim 26, wherein the I/O backplane of the first function subassembly, the second function subassembly and third function subassembly each extend in a single plane within the chassis.

33. The system of claim 26, wherein the first, second and third computers include a fourth, a fifth and a sixth function subassembly, respectively, and wherein the fourth, fifth and sixth function subassemblies each include:
   a processor-memory (PM) backplane;
   a memory circuit board connected to the PM backplane;
   a plurality of memory cards connected to the memory circuit board;
   a processor circuit board connected to the PM backplane; and
   a plurality of processors connected to the processor circuit board;
   wherein the first, second and third computers include a seventh, eighth and ninth function subassembly, respectively, each of the seventh, eighth and ninth function subassemblies Including a fan system, wherein the fourth, fifth and sixth function subassemblies are horizontally between the first, second and third function subassemblies and the seventh, eighth and ninth function subassemblies.

34. The system of claim 27, wherein the third function subassembly and the fourth function subassembly are grouped together within the chassis.

35. The system of claim 28, wherein the fifth function subassembly and the sixth function subassembly are grouped together within the chassis.

36. The system of claim 28, wherein the fifth function subassembly and the sixth function subassembly each comprise power supplies.

37. The system of claim 28, wherein the fifth and sixth function subassembly each include a disk drive and wherein the third function subassembly and the fourth function subassembly each include:
   a processor memory (PM) backplane;

a plurality of memory cards coupled to the PM backplane; and a plurality of processors coupled to the PM backplane.

38. The system of claim 31, wherein the fourth, fifth and sixth function subassemblies each include:
a processor-memory (PM) backplane;
a plurality of memory cards coupled to the PM backplane; and
a plurality of processors coupled to the PM backplane.

39. The system of claim 32, wherein the I/O backplane of the first function subassembly, the second function subassembly and the third function subassembly each extend in a vertical plane within the chassis.

40. The system of claim 32, wherein the I/O backplane of the first function subassembly, the second function subassembly and the third function subassembly each have a major dimension and a minor dimension and wherein the major dimension extends vertically within the chassis.

41. The system of claim 33, wherein the chassis has a maximum depth of 20 inches.

42. The system of claim 33, wherein the third, fourth and fifth function subassemblies are vertically stacked adjacent one another.

43. The system of claim 34, wherein the third function subassembly and the fourth function subassembly extend adjacent to one another within the chassis.

44. The system of claim 34, wherein the third function subassembly and the fourth function subassembly each include:
a processor-memory (PM) backplane;
a plurality of memory cards coupled to the PM backplane; and
a plurality of processors coupled to the PM backplane.

45. The system of claim 35, wherein the fifth function subassembly and the sixth function subassembly are substantially identical to one another.

46. The system of claim 38, wherein the PM backplane of the fourth, fifth and sixth function subassemblies extend in a single plane.

47. The system of claim 38, wherein the PM backplane of the fourth, fifth and sixth function subassemblies each extend in a horizontal plane.

48. The system of claim 38, wherein the PM backplane of the fourth, fifth and sixth function subassemblies and the I/O backplane of the first, second and third function subassemblies are separated by a space.

49. The system of claim 42 including at least one power supply and at least one disk drive vertically positioned above or below the vertically stacked third, fourth and fifth function subassemblies.

50. The system of claim 44, wherein the PM backplane of the third function subassembly and the PM backplane of the fourth function subassembly extend in a single plane.

51. The system of claim 44 including a memory circuit board connected to the PM backplane, wherein the plurality of memory cards are connected to the memory circuit board.

52. The system of claim 44, wherein the PM backplane of the third function subassembly extends in a horizontal plane.

53. The system of claim 47 including cabling connecting the I/O backplane of the first function subassembly, the second function subassembly and the third function subassembly to the PM backplane of the fourth function subassembly, the fifth function subassembly and the sixth function subassembly, respectively.

54. The system of claim 48 including at least one fan configured to blow air through the first function subassembly, the second function subassembly and the third function subassembly, from the first function subassembly, the second function subassembly and the third function subassembly through the space to the fourth function subassembly, the fifth function subassembly and the sixth function subassembly and through the fourth function subassembly, the fifth function subassembly and the sixth function subassembly.

55. The system of claim 49, wherein the chassis has a maximum height of 26 inches.

56. The system of claim 50, wherein the PM backplane of the third function subassembly extends in a horizontal plane.

57. The system of claim 51 including a processor circuit board connected to the PM backplane, wherein the plurality of processors are connected to the processor circuit board.

58. The system of claim 55, wherein the chassis has a maximum depth of 20 inches.

59. The system of claim 56, wherein the I/O backplane of the first function subassembly and the PM backplane of the third function subassembly are separated by a space.

60. The system of claim 56 including a cable connecting the I/O backplane of the first function subassembly to the PM backplane of the second function subassembly.

61. The system of claim 58, wherein the chassis has a maximum width of 17.5 inches.

62. The system of claim 59, wherein the system includes a fan within the chassis configured to blow air through the first function subassembly, from the first function subassembly through the space to the second function subassembly and through the second function subassembly.

63. The system of claim 59 including a cable connecting the I/O backplane of the first function subassembly to the PM backplane of the first function subassembly.

64. A multi-computer system comprising:
a chassis; and
a plurality of independently operable computers within the chassis, each computer including:
a first backplane with a major dimension and a minor dimension, wherein the major dimension extends in one of a vertical direction and a horizontal direction; and
a second backplane having a major dimension and a minor dimension, wherein the major dimension extends in the other of the vertical direction and the horizontal direction; and
a plurality of input-output (I/O) cards connected to the first backplane, wherein each card of the plurality of I/O cards has a major dimension and a minor dimension and wherein the major dimension extends in said one of the vertical direction and the horizontal direction.

65. The system of claim 64, wherein the first backplane of each of the plurality of computers extends in a common plane.

66. The system of claim 64, wherein the second backplane of each of the plurality of computers extends in a common plane.

67. The system of claim 64 including a plurality of cables connecting the first backplane of each of the plurality of computers to the second backplane of each of the plurality of computers.

68. The system of claim 65, wherein the second backplane of each of the plurality of computers extends in a common plane.

69. A multi-computer system comprising:
a chassis;
a first computer within the chassis having a first function subassembly configured to perform at least one function of the computer; and a second computer within the chassis and operable independent of the first computer, the second computer including a second function subassembly configured to perform the same at least one function for the second computer that the first function subassembly performs, wherein the first function subassembly and the second function subassembly are grouped together within the chassis, wherein the first function subassembly and the second function subassembly each include:

a processor-memory (PM) backplane;

a plurality of memory cards coupled to the PM backplane; and a plurality of processors coupled to the PM backplane.

70. The system of claim 69 including a processor circuit board connected to the PM backplane, wherein the plurality of processors are connected to the processor circuit board.

71. The system of claim 69, wherein the PM backplane of the first function subassembly and the PM backplane of the second function subassembly extend in a single plane.

72. The system of claim 69, wherein the PM backplane of the first function subassembly extends in a horizontal plane.

73. The system of claim 70 including a memory circuit board connected to the PM backplane, wherein the plurality of memory cards are connected to the memory circuit board.

74. The system of claim 71, wherein the PM backplane of the first function subassembly extends in a horizontal plane.

75. A multi-computer system comprising:

a chassis;

a first computer within the chassis having a first function subassembly configured to perform at least one function of the computer; and a second computer within the chassis and operable Independent of the first computer, the second computer including a second function subassembly configured to perform the same at least one function for the second computer that the first function subassembly performs, wherein the first function subassembly and the second function subassembly are grouped together within the chassis, wherein the at least one function is providing power.

76. A multi-computer system comprising:

a chassis; and a plurality of independently operable computers within the chassis, each computer including:

a first backplane with a major dimension and a minor dimension, wherein the major dimension extends in one of a vertical direction and a horizontal direction;

a second backplane having a major dimension and a minor dimension, wherein the major dimension extends in the other of the vertical direction and the horizontal direction; and a plurality of cables connecting the first backplane of each, of the plurality of computers to the second backplane of each of the plurality of computers.

77. A multi-computer system comprising:

a chassis;

a first computer within the chassis having a first function subassembly configured to perform at least one function of the computer; and a second computer within the chassis and operable independent of the first computer, the second computer including a second function subassembly configured to perform the same at least one function for the second computer that the first function subassembly performs, wherein the first function subassembly and the second function subassembly are grouped together within the chassis, wherein the first function subassembly and the second function subassembly are grouped together without intervening walls.

78. A multi-computer system comprising:

a chassis;

a first computer within the chassis having a first function subassembly configured to perform at least one function of the computer; and a second computer within the chassis and operable independent of the first computer, the second computer including a second function subassembly configured to perform the same at least one function for the second computer that the first function subassembly performs, wherein the first function subassembly and the second function subassembly are grouped together within the chassis, wherein the first computer includes a third function subassembly and a fourth function subassembly, wherein the second computer includes a fifth function subassembly and a sixth function subassembly, wherein the first function subassembly and the second function subassembly form a first function subassembly group, wherein the third function subassembly and the fifth function subassembly are grouped together within the chassis to form a second function subassembly group, wherein the fourth function subassembly and the sixth function subassembly are grouped together within the chassis to form a third function subassembly group and wherein the third function subassembly group is between the first function subassembly group and the second function subassembly group.

\* \* \* \* \*

UNITED STATES PATENT AND TRADEMARK OFFICE
CERTIFICATE OF CORRECTION

| | | |
|---|---|---|
| PATENT NO. | : 7,136,283 B2 | Page 1 of 1 |
| APPLICATION NO. | : 10/459172 | |
| DATED | : November 14, 2006 | |
| INVENTOR(S) | : Robert W. Dobbs et al. | |

It is certified that error appears in the above-identified patent and that said Letters Patent is hereby corrected as shown below:

In column 8, line 32, in Claim 1, delete "Including" and insert -- including --, therefor.

In column 8, lines 43-44, in Claim 2, delete "Identical" and insert -- identical --, therefor.

In column 8, line 48, in Claim 4, delete "claim 1" and insert -- claim 1, --, therefor.

In column 9, line 26, in Claim 15, delete "Intervening" and insert -- intervening --, therefor.

In column 9, line 32, in Claim 16, delete "form," and insert -- form --, therefor.

In column 10, line 2, in Claim 25, delete "Identical" and insert -- identical --, therefor.

In column 10, line 8, in Claim 26, delete "VO" and insert -- I/O --, therefor.

In column 10, line 49, in Claim 33, delete "Including" and insert -- including --, therefor.

In column 13, lines 32-33, in Claim 75, delete "Independent" and insert -- independent --, therefor.

In column 14, line 2, in Claim 76, delete "each," and insert -- each --, therefor.

Signed and Sealed this

Twelfth Day of January, 2010

David J. Kappos
*Director of the United States Patent and Trademark Office*